United States Patent
Joo et al.

(10) Patent No.: US 10,797,662 B2
(45) Date of Patent: Oct. 6, 2020

(54) AMPLIFYING CIRCUIT INCLUDING MILLER COMPENSATION CIRCUIT

(71) Applicant: SAMSUNG ELECTRONICS CO., LTD., Suwon-si (KR)

(72) Inventors: Seong-won Joo, Seoul (KR); Ji-soo Chang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 19 days.

(21) Appl. No.: 16/277,093

(22) Filed: Feb. 15, 2019

(65) Prior Publication Data
US 2019/0305739 A1   Oct. 3, 2019

(30) Foreign Application Priority Data
Mar. 27, 2018 (KR) .................. 10-2018-0035397

(51) Int. Cl.
| H03F 1/14 | (2006.01) |
| H03F 3/45 | (2006.01) |
| H03F 3/193 | (2006.01) |
| H03F 3/21 | (2006.01) |

(52) U.S. Cl.
CPC ......... *H03F 3/45179* (2013.01); *H03F 3/193* (2013.01); *H03F 3/21* (2013.01)

(58) Field of Classification Search
CPC ........ H03F 1/34; H03F 3/45; H03F 2200/147; H03F 2200/153; H03F 1/14
USPC ................... 330/258, 259, 260, 292
See application file for complete search history.

(56) References Cited

U.S. PATENT DOCUMENTS

| 5,880,634 | A | 3/1999 | Babanezhad |
| 6,963,245 | B2 | 11/2005 | van Engelen et al. |
| 7,646,241 | B2 | 1/2010 | Lee et al. |
| 7,999,612 | B2 | 8/2011 | Hsieh |
| 8,963,639 | B2 | 2/2015 | Yan et al. |
| 9,000,839 | B2 | 4/2015 | Yendluri et al. |
| 9,184,730 | B2 | 11/2015 | Wang et al. |
| 9,628,035 | B2 | 4/2017 | Tsai et al. |
| 9,716,470 | B2 | 7/2017 | Bandyopadhyay |
| 2007/0188231 | A1* | 8/2007 | Gupta ................. H03F 3/45192 330/258 |

* cited by examiner

*Primary Examiner* — Steven J Mottola
(74) *Attorney, Agent, or Firm* — Sughrue Mion, PLLC

(57) ABSTRACT

An amplifying circuit may include: an amplifier configured to receive a first input voltage and output a first output voltage by amplifying the first input voltage; and a common-mode feedback circuit configured to enable the first output voltage to operate in a common mode by receiving the first output voltage and performing a feedback to adjust at least one feedback voltage applied to the amplifier based on the first output voltage. The common-mode feedback circuit may include a first Miller compensation circuit configured to perform dominant pole compensation by using a Miller effect for the common-mode feedback circuit. The first Miller compensation circuit may include a resistor and a capacitor.

17 Claims, 13 Drawing Sheets

US 10,797,662 B2

AMPLIFYING CIRCUIT INCLUDING MILLER COMPENSATION CIRCUIT

CROSS-REFERENCE TO THE RELATED APPLICATION

This application claims priority from Korean Patent Application No. 10-2018-0035397, filed on Mar. 27, 2018 in the Korean Intellectual Property Office, the disclosure of which is incorporated herein in its entirety by reference.

BACKGROUND

1. Field

Apparatuses and methods consistent with example embodiments relate to an amplifier, and more particularly, to an amplifying circuit capable of performing a common-mode feedback via a Miller compensation circuit.

2. Description of the Related Art

Operational amplifiers (OP AMPs) corresponding to one of analog integrated circuits may be circuits for amplifying and outputting input voltages. The OP AMPs may have characteristics of infinite gain, infinite input impedance, and zero output impedance.

Among the OP AMPs, operational trans-conductance amplifiers (OTAs) may, as circuit blocks, generate output voltages by amplifying input voltages and operate as a kind of a control current source which has infinite input impedance and represents an input/output transfer function in conductance.

SUMMARY

One or more example embodiments provide an amplifier in which the stability of a whole system thereof may not be reduced even with a large increase in a gain by using a common-mode feedback circuit including a Miller compensation circuit.

According to an aspect of an example embodiment, an amplifying circuit may include: an amplifier configured to receive a first input voltage and output a first output voltage by amplifying the first input voltage; and a common-mode feedback circuit configured to enable the first output voltage to operate in a common mode by receiving the first output voltage and performing a feedback to adjust at least one feedback voltage applied to the amplifier based on the first output voltage. The common-mode feedback circuit may include a first Miller compensation circuit configured to perform dominant pole compensation by using a Miller effect for the common-mode feedback circuit. The first Miller compensation circuit may include a first resistor and a first capacitor.

According to an aspect of an example embodiment, a common-mode feedback circuit may include: an output voltage sensing circuit configured to output a first sensing voltage by sensing a differential voltage received from an external circuit; and an operational amplifier configured to adjust a feedback voltage based on the first sensing voltage and a reference voltage. The common-mode feedback circuit may be configured to control the differential voltage received from the external circuit to operate in a common mode, by adjusting the feedback voltage output to the external circuit based on the differential voltage received from the external circuit. The operational amplifier may include a first Miller compensation circuit in which a first resistor and a first capacitor are connected in series with each other.

According to an aspect of an example embodiment, an amplifying circuit may include: an amplifier configured to receive a first input voltage and output a first output voltage by amplifying the first input voltage; and an operational amplifier configured to adjust a feedback voltage applied to the amplifying circuit based on the first output voltage and a reference voltage. The operational amplifier may include: a first transistor including a first gate terminal to which a first sensing voltage generated based on the first output voltage is applied, a first terminal connected to a first node, and a second terminal connected to a third node; a second transistor including a second gate terminal to which the reference voltage is applied, a third terminal connected to a second node, and a fourth terminal connected to the third node; and a Miller compensation circuit connected between the first node and the second node, the Miller compensation circuit including at least one of a first resistor and a first capacitor. The feedback voltage may have a voltage level of the first node.

BRIEF DESCRIPTION OF THE DRAWINGS

The above and/or other aspects will be more clearly understood from the following detailed description taken in conjunction with the accompanying drawings in which.

DETAILED DESCRIPTION OF THE EXAMPLE EMBODIMENTS

Figure 1:
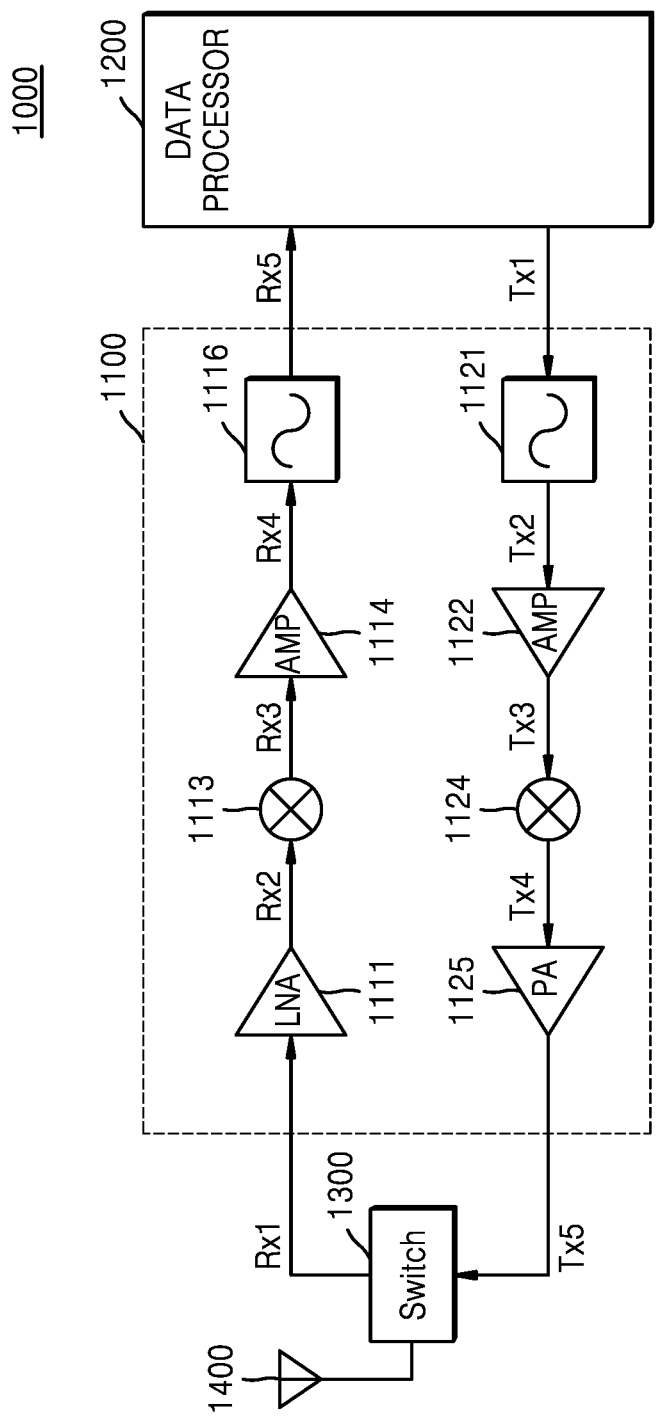
FIG. 1 is a diagram illustrating a wireless communication device according to an example embodiment.

Reference will now be made in detail to example embodiments, with reference to the accompanying drawings. In the drawings, parts irrelevant to the description are omitted to clearly describe the example embodiments, and like reference numerals refer to like elements throughout the specification. In this regard, the present example embodiments may have different forms and should not be construed as being limited to the descriptions set forth herein.

Throughout the specification, when it is described that a certain element is "connected" to another element, it should be understood that the certain element may be "directly connected" to another element or "electrically connected" to another element via another element in the middle. In addition, when a component "includes" an element, unless there is another opposite description thereto, it should be understood that the component does not exclude another element but may further include another element.

As used herein, the term "and/or" includes any and all combinations of one or more of the associated listed items. Expressions such as "at least one of," when preceding a list of elements, modify the entire list of elements and do not modify the individual elements of the list. It will be apparent that though the terms "first," "second," "third," etc. may be used herein to describe various members, components, regions, layers, and/or sections, these members, components, regions, layers, and/or sections should not be limited by these terms. These terms are only used to distinguish one member, component, region, layer, or section from another region, layer, or section. Thus, a first member, component, region, layer, or section discussed below could be termed a second member, component, region, layer, or section without departing from the teachings of the example embodiments.

Hereinafter, the present disclosure is described in detail with reference to the accompanying drawings.

FIG. 1 is a diagram illustrating a wireless communication device 1000 according to an example embodiment.

Referring to FIG. 1, the wireless communication device 1000 may include a transceiver 1100, a data processor 1200, a switch 1300, and an antenna 1400. The transceiver 1100 may include a low noise amplifier (LNA) 1111, a receiving mixer 1113, a receiving amplifier 1114, a receiving filter 1116, a transmitting filter 1121, a transmitting amplifier 1122, a transmitting mixer 1124, and a power amplifier (PA) 1125.

In a receiving mode, the switch 1300 may output a first received signal Rx1 received via the antenna 1400 to the LNA 1111. The LNA 1111 may amplify the first received signal Rx1 to generate a second received signal Rx2. The receiving mixer 1113 may generate a third received signal Rx3 by down-converting the second received signal Rx2, and the receiving amplifier 1114 may generate a fourth received signal Rx4 by amplifying the third received signal Rx3. The receiving filter 1116 may generate a fifth received signal Rx5 by filtering the fourth received signal Rx4 and output the fifth received signal Rx5 to the data processor 1200.

In a transmitting mode, the data processor 1200 may generate a first transmitted signal Tx1 and output the first transmitted signal Tx1 to the transceiver 1100. The transmitting filter 1121 may generate a second transmitted signal Tx2 by filtering the first transmitted signal Tx1, and the transmitting amplifier 1122 may generate a third transmitted signal Tx3 by amplifying the second transmitted signal Tx2. The transmitting mixer 1124 may generate a fourth transmitted signal Tx4 by up-converting the third transmitted signal Tx3, and the PA 1125 may amplify the fourth transmitted signal Tx4 to generate a fifth transmitted signal Tx5. The switch 1300 may connect the PA 1125 to the antenna 1400, and the fifth transmitted signal Tx5 may be output to the outside via the antenna 1400.

In a fully differential amplification, when all of a plurality of biases applied to the LNA 1111, the receiving amplifier 1114, the transmitting amplifier 1122, and the PA 1125 are fixed, ranges of output signals of the LNA 1111, the receiving amplifier 1114, the transmitting amplifier 1122, and the PA 1125 may not be secured or gains thereof may be reduced due to a power change, a temperature change, a process change, changes between input common modes and output common modes of the LNA 1111, the receiving amplifier 1114, the transmitting amplifier 1122, and the PA 1125, or changes in the output common mode due to noise. In other words, when there is no difference in the input signals at the LNA 1111, the receiving amplifier 1114, the transmitting amplifier 1122, and the PA 1125, outputs of the LNA 1111, the receiving amplifier 1114, the transmitting amplifier 1122, and the PA 1125 may be in an intermediate level of an entire voltage swing range, but the outputs of the LNA 1111, the receiving amplifier 1114, the transmitting amplifier 1122, and the PA 1125 performing the fully differential amplification may be shifted to other levels rather than the intermediate level, so that operations of the LNA 1111, the receiving amplifier 1114, the transmitting amplifier 1122, and the PA 1125 may be restricted.

To prevent the restricted operations, a common-mode feedback (CMFB) circuit may be used. The CMFB circuit may be a negative feedback circuit which detects a common mode voltage of an amplifier, compares the detected common mode voltage with a reference voltage, and changes the detected common mode voltage to conform to the reference voltage according to a result of comparison. The CMFB circuit may be used at an output terminal to establish a common mode of differential output voltages, thereby facilitating low voltage and low power operation of the amplifier.

However, it may be required to increase the gain of the CMFB circuit to adjust the voltage level of differential output voltages to the reference voltage level and thus, the stability of an entire system may decrease as the gain of the CMFB circuit increases.

The LNA 1111, the receiving amplifier 1114, the transmitting amplifier 1122, and the PA 1125 according to the technical idea of the present disclosure may include the CMFB circuit, and the CMFB circuit may include a Miller compensation circuit (MCC) which performs dominant pole compensation by using the Miller effect. The CMFB circuit may include an independent MCC to sufficiently increase the gain of the CMFB circuit without degrading the stability of the entire system and accordingly, since the LNA 1111, the receiving amplifier 1114, the transmitting amplifier 1122, and the PA 1125 stably operate in the common mode, there may not be a limit due to the swing level width for the output voltage.

An example embodiment is described with reference to FIG. 1 in which the technical idea of the present disclosure is applied to the LNA 1111, the receiving amplifier 1114, the transmitting amplifier 1122, and the PA 1125 included in the transceiver 1100, but the technical idea of the present disclosure may be applied to any configurations including amplifiers (for example, the receiving filter 1116 and the transmitting filter 1121) and may be applied to amplifiers included in other integrated circuits which are different from the transceiver 1100.

Figure 2:
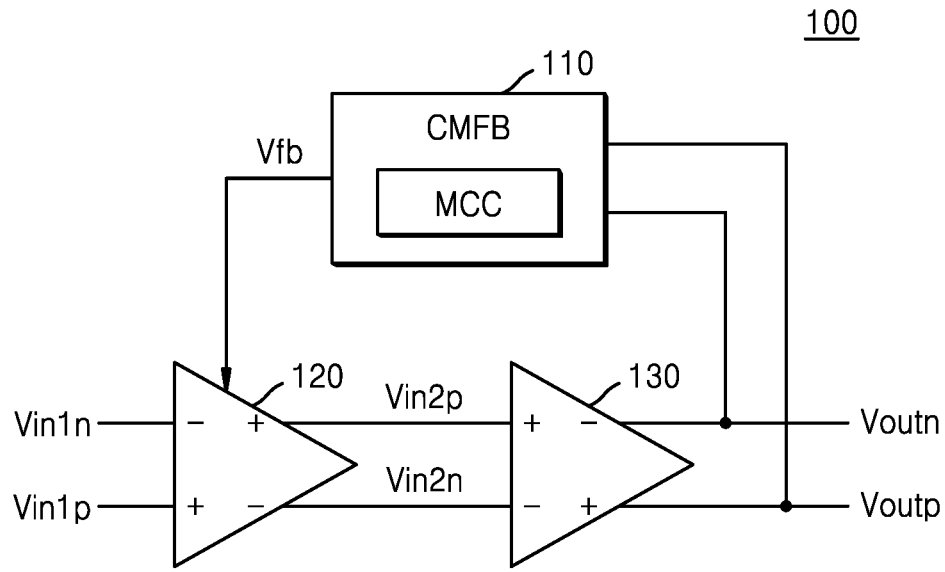
FIG. 2 is a block diagram illustrating an amplifying circuit according to an example embodiment.

FIG. 2 is a block diagram illustrating an amplifying circuit 100 according to an example embodiment.

Referring to FIG. 2, the amplifying circuit 100 may include a CMFB circuit 110, a first amplifier 120, and a second amplifier 130. The first amplifier 120 may output a third input voltage Vin2$p$ and a fourth input voltage Vin2$n$ by receiving and amplifying a first input voltage Vin1$p$ and a second input voltage Vin1$n$. In one embodiment, the first input voltage Vin1p and the second input voltage Vin1n may be differential signals having opposite phases to each other, and the third input voltage Vin2p and the fourth input voltage Vin2n may also be differential signals having opposite phases to each other. In addition, the first amplifier 120 may be an inverting amplifier that inverts a phase of an input signal.

The second amplifier 130 may receive and amplify the third input voltage Vin2p and the fourth input voltage Vin2n as input voltages to output a first output voltage Voutp and a second output voltage Voutn. The first output voltage Voutp and the second output voltage Voutn may be differential signals having opposite phases to each other, and the second amplifier 130 may be an inverting amplifier that inverts the phase of the input signal. An amplifier performing a two-stage amplification through the first amplifier 120 and the second amplifier 130 as described above may be referred to as a two-stage amplifier.

The CMFB circuit 110 may adjust a feedback voltage Vfb output to the first amplifier 120 based on the first output voltage Voutp and the second output voltage Voutn. According to the technical idea of the present disclosure, the CMFB circuit 110 may include an MCC. The MCC may generate a main pole according to the Miller effect and add a negative zero to the CMFB circuit 110 by creating its own compensation loop in the CMFB circuit 110.

A Miller capacitor included in the MCC may be made to have capacitance greater than an original capacitance due to the Miller effect, and a dominant pole of the CMFB circuit 110 may move and function as a dominant pole due to an addition of Miller capacitance and Miller resistance. An operation in which the MCC generates a main pole according to the Miller effect for the CMFB circuit 110 as described above in this specification may be referred to as a dominant pole compensation.

In addition, the MCC may include a Miller resistor connected in series to the Miller capacitor, and due to an addition of the Miller resistance to the CMFB circuit 110, a zero point may be added to a negative region of a pole-zero plot, and the zero point added to the negative region may be referred to as a negative zero point. According to the technical idea of the present disclosure, since the MCC is added to the CMFB circuit 110, the dominant pole compensation may be performed, and the stability of the CMFB circuit 110 may be increased by adding the zero point in the negative region.

Figure 3:
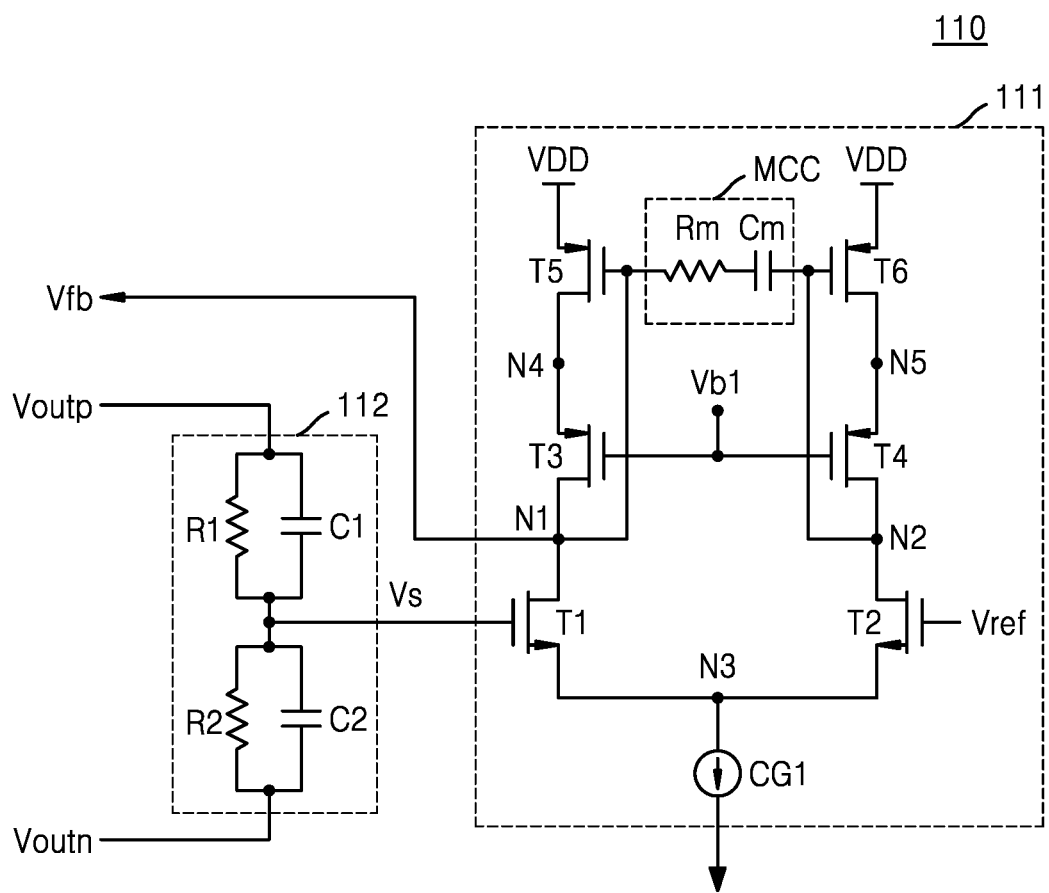
FIG. 3 is a circuit diagram illustrating a common-mode feedback circuit according to an example embodiment.

FIG. 3 is a circuit diagram illustrating the CMFB circuit 110 according to an example embodiment. Descriptions already provided above with reference to FIG. 2 are omitted.

Referring to FIG. 3, the CMFB circuit 110 may include an operational amplifier 111 and an output voltage sensing circuit 112. The output voltage sensing circuit 112 may receive the first output voltage Voutp and the second output voltage Voutn, and output a sensing voltage Vs. The output voltage sensing circuit 112 may include a first sensing circuit in which a first resistor R1 and a first capacitor C1 are connected in parallel with each other, and a second sensing circuit in which a second resistor R2 and a second capacitor C2 are connected in parallel with each other.

The operational amplifier 111 may receive the sensing voltage Vs from the output voltage sensing circuit 112 and adjust the feedback voltage Vfb based on the sensing voltage Vs and a reference voltage Vref. The operational amplifier 111 may include a first transistor T1, a second transistor T2, a third transistor T3, a fourth transistor T4, a fifth transistor T5, a sixth transistor T6, a first current source CG1, and the MCC.

The first transistor T1 receives the sensing voltage Vs via a gate terminal thereof and adjusts the current between a first node N1 and a third node N3 based on the sensing voltage Vs. The second transistor T2 receives the reference voltage Vref through the gate terminal thereof and can adjust the current between a second node N2 and the third node N3 based on the reference voltage Vref. The third transistor T3 may receive a first bias voltage Vb1 at a gate terminal thereof and adjust the current between a fourth node N4 and the first node N1 based on the first bias voltage Vb1. The fourth transistor T4 may receive the first bias voltage Vb1 at a gate terminal thereof and adjust the current between a fifth node N5 and the second node N2 based on the first bias voltage Vb1.

A gate terminal of the fifth transistor T5 may be connected to the first node N1, and the fifth transistor T5 may apply a power supply voltage VDD to the fourth node N4 based on a voltage level of the first node N1. A gate terminal of the sixth transistor T6 may be connected to the second node N2, and the sixth transistor T6 may apply the power supply voltage VDD to the fifth node N5 based on a voltage level of the second node N2. The voltage level of the first node N1 determined by the first through sixth transistors T1 through T6 may be output to the first amplifier (120 in FIG. 2) as the feedback voltage Vfb.

The MCC may be connected between the first node N1 and the second node N2. In one embodiment, the MCC may include a Miller resistor Rm and a Miller capacitor Cm connected in series to each other, and the first node N1 may have an impedance of 1/gm. In one embodiment, a transfer function H(s) of the CMFB circuit 110 may be expressed as Formula 1 below, where s represents a complex variable.

$$H(s) = \frac{1 + sRmCm}{1 + s\left(Rm + \frac{2}{gm}\right)Cm} \quad \text{[Formula 1]}$$

According to the technical idea of the present disclosure, as the MCC is included in the CMFB circuit 110, a zero point of −1/RmCm may be added, and as a capacitance of the Miller capacitor Cm is doubled due to the Miller effect, the main pole compensation may be performed in which the dominant pole is generated. An addition of the Miller resistor Rm may also help the dominant pole compensation. Accordingly, the stability of the CMFB circuit 110 may be increased.

Figure 4:
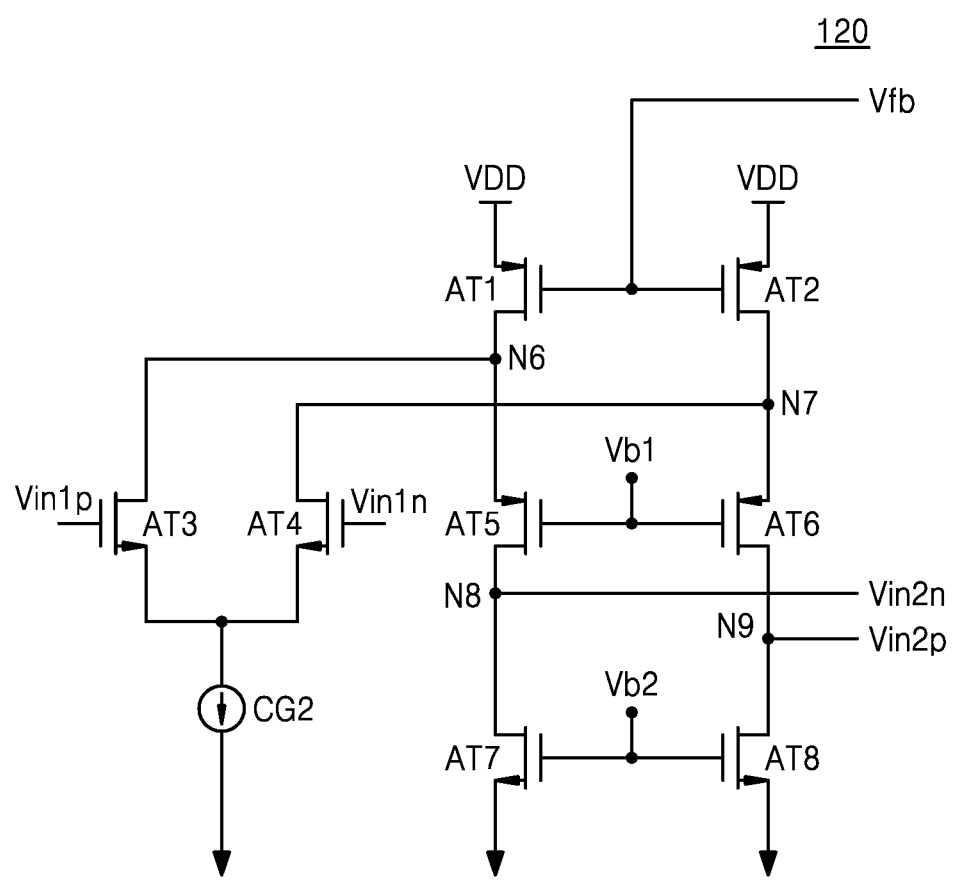
FIG. 4 is a circuit diagram illustrating a first amplifier according to an example embodiment.

FIG. 4 is a circuit diagram illustrating a first amplifier 120 according to an example embodiment. Descriptions already provided above with reference to FIG. 2 are omitted.

Referring to FIG. 4, the first amplifier 120 may include a first transistor AT1, a second transistor AT2, a third transistor AT3, a fourth transistor AT4, a fifth transistor AT5, a sixth transistor AT6, a seventh transistor AT7, an eighth transistor AT8, and a second current source CG2.

The first transistor AT1 may receive via a gate terminal thereof the feedback voltage Vfb from the CMFB circuit 110 and apply the power supply voltage VDD to the sixth node N6 based on the feedback voltage Vfb. The second transistor AT2 may receive via a gate terminal thereof the feedback voltage Vfb from the CMFB circuit 110 and apply the power supply voltage VDD to the seventh node N7 based on the feedback voltage Vfb. As the first transistor AT1 and the second transistor AT2 adjust the voltage levels of the sixth node N6 and the seventh node N7 based on the feedback voltage Vfb, voltage levels of the third input voltage Vin2p of a ninth node N9 and the fourth input voltage Vin2n of an eighth node N8 may be adjusted and consequently, the CMFB may be performed.

The third transistor AT3 may receive via a gate terminal thereof the first input voltage Vin1p and adjust the current between the sixth node N6 and the second current source CG2 based on the first input voltage Vin1p. The fourth transistor AT4 may receive via a gate terminal thereof the second input voltage Vin1n and adjust the current between the seventh node N7 and the second current source CG2 based on the second input voltage Vin1n. The gate terminal of the third transistor AT3 and the gate terminal of the fourth transistor AT4 may serve as input terminals of the first amplifier 120.

The fifth transistor T5 may receive via a gate terminal thereof the first bias voltage Vb1 and adjust the current between the sixth node N6 and the eighth node N8 based on the first bias voltage Vb1. The sixth transistor T6 may receive via a gate terminal thereof the first bias voltage Vb1 and adjust current between the seventh node N7 and the ninth node N9 based on the first bias voltage Vb1. The eighth node N8 and the ninth node N9 may serve as output terminals of the first amplifier 120. In other words, a voltage level of the eighth node N8 may be output to the second amplifier (130 in FIG. 2) as the fourth input voltage Vin2n and a voltage level of the ninth node N9 may be output to the second amplifier (130 in FIG. 2) as the third input voltage Vin2p.

The seventh transistor AT7 may receive via a gate terminal thereof the second bias voltage Vb2 and apply a ground voltage to the eighth node N8 based on the second bias voltage Vb2. In addition, the eighth transistor AT8 may receive via a gate terminal thereof the second bias voltage Vb2 and apply the ground voltage to the ninth node N9 based on the second bias voltage Vb2.

According to the technical idea of the present disclosure, the first amplifier 120 may include eight transistors, and gate lengths of the seventh transistor AT7 and the eighth transistor AT8 connected to both the ground voltage and the output terminals may be greater than the gate lengths of the first through sixth transistors AT1 through AT6. In one example, the gate lengths of the seventh transistor AT7 and the eighth transistor AT8 may be greater than the gate lengths of the fifth transistor AT5 and the sixth transistor AT6. According to one embodiment, the first amplifier 120 may include only eight transistors to reduce required bias voltages and a circuit area for the first amplifier 120.

Figure 5:
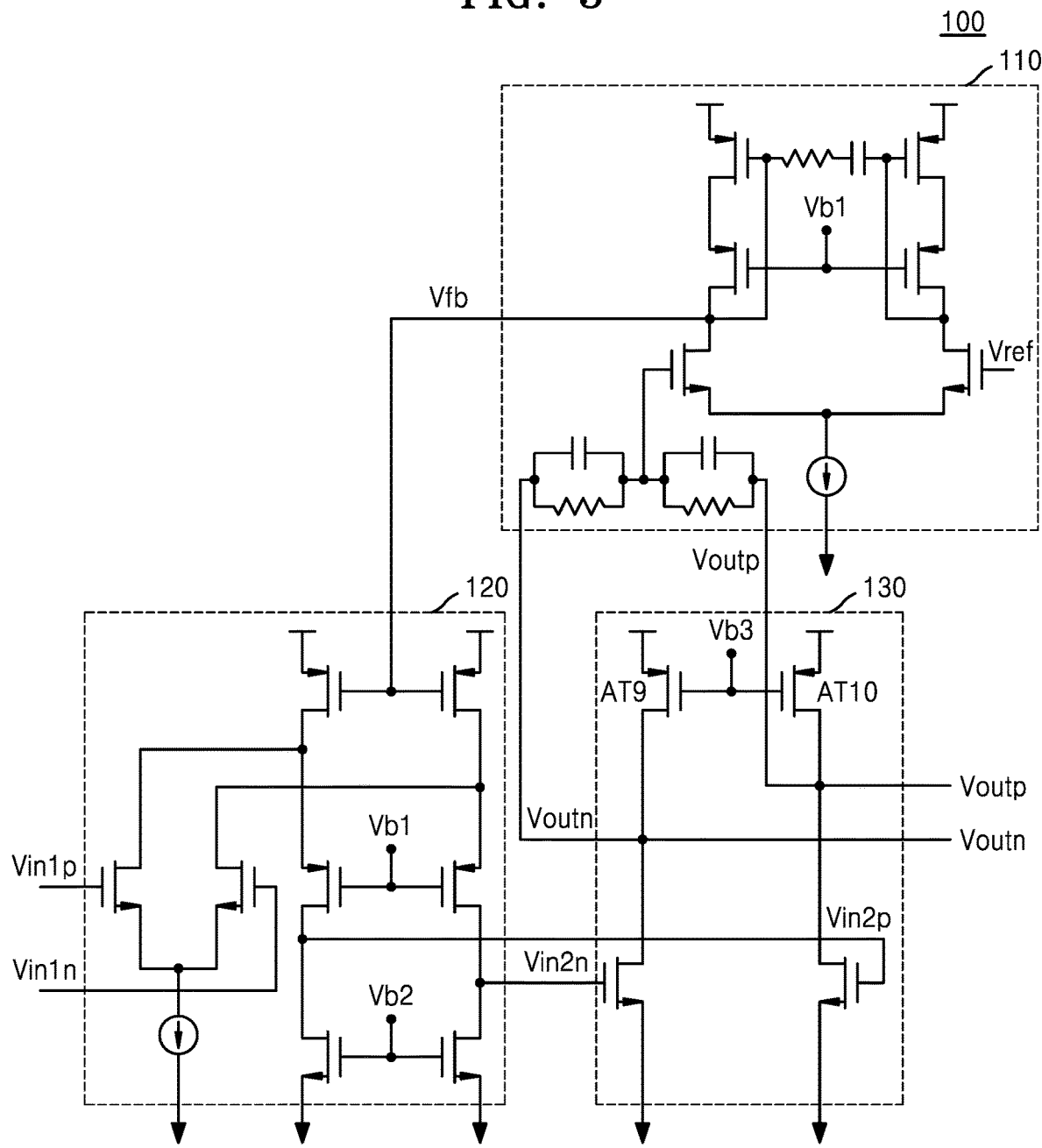
FIG. 5 is a circuit diagram illustrating an amplifying circuit according to an example embodiment.

FIG. 5 is a circuit diagram illustrating the amplifying circuit 100 according to an example embodiment. Descriptions already provided above with reference to FIGS. 2 through 4 are omitted.

Referring to FIG. 5, the amplifying circuit 100 may include the CMFB circuit 110, the first amplifier 120, and the second amplifier 130. The CMFB circuit 110 and the first amplifier 120 have been described above with reference to FIGS. 3 and 4, respectively, and the descriptions thereof are omitted.

The second amplifier 130 may generate the first output voltage Voutp and the second output voltage Voutn by amplifying the third and fourth input voltages Vin2p and Vin2n received from the first amplifier 120 and output the first output voltage Voutp and the second output voltage Voutn to the outside via the output terminals. In one embodiment, the second amplifier 130 may include a ninth transistor AT9 and a tenth transistor AT10, to which a third bias voltage Vb3 is applied, and may determine voltage levels of the first output voltage Voutp and the second output voltage Voutn based on the third input voltage Vin2p and the fourth input voltage Vin2n. In addition, the first output voltage Voutp and the second output voltage Voutn may be output to the CMFB circuit 110.

Figure 6:
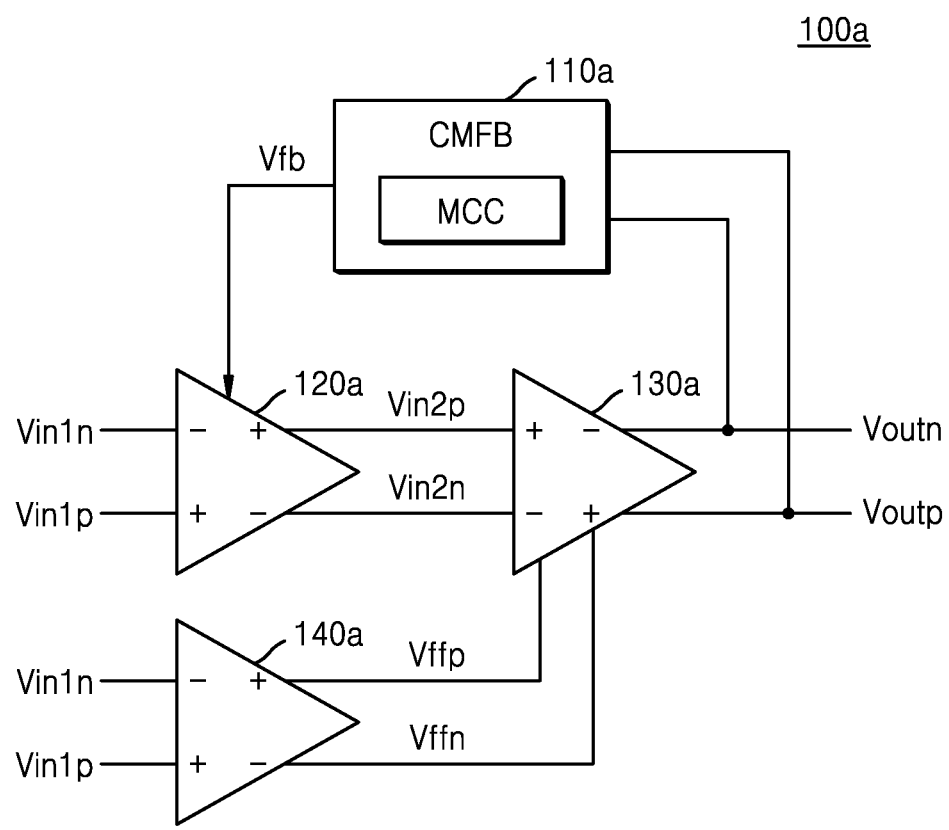
FIG. 6 is a block diagram illustrating an amplifying circuit according to an example embodiment.

FIG. 6 is a block diagram illustrating an amplifying circuit 100a according to an example embodiment. Descriptions already provided above with reference to FIG. 2 are omitted.

Referring to FIG. 6, the amplifying circuit 100a may include a CMFB circuit 110a, a first amplifier 120a, a second amplifier 130a, and a feedforward circuit 140a. The CMFB circuit 110a and the first amplifier 120a may be substantially the same as or similar to the CMFB circuit 110 and the first amplifier 120 in FIG. 2, respectively, and a description thereof is omitted.

The feedforward circuit 140a may receive the first input voltage Vin1p and the second input voltage Vin1n, and output a first feedforward voltage Vffp and a second feedforward voltage Vffn to the second amplifier 130a to perform a feedforward compensation. The feedforward compensation may be an opposite concept of a feedback compensation and indicate compensating a result value based on an initial input.

The feedforward circuit 140a may generate the first feedforward voltage Vffp and the second feedforward voltage Vffn based on the first input voltage Vin1p and the second input voltage Vin1n, and output the first feedforward voltage Vffp and the second feedforward voltage Vffn to the second amplifier 130a. The second amplifier 130a may generate the first output voltage Voutp and the second output voltage Voutn having reduced noise by amplifying the third input voltage Vin2p and the fourth input voltage Vin2n based on the feedback voltage Vfb from the CMFB circuit 110a and the first feedforward voltage Vffp and the second feedforward voltage Vffn received from the feedforward circuit 140a, and may increase the stability of the amplifying circuit 100a.

Figure 7:
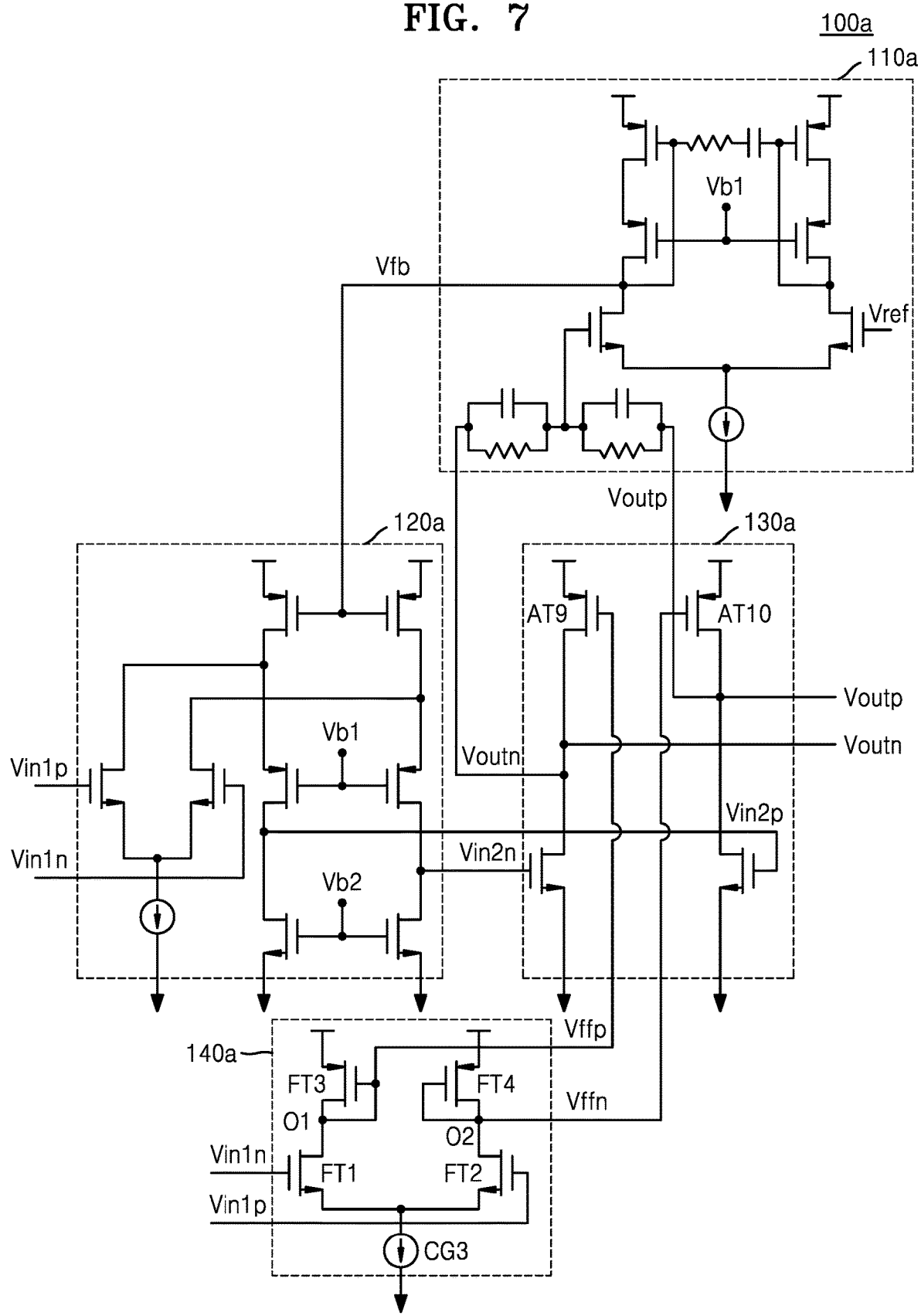
FIG. 7 is a circuit diagram illustrating an amplifying circuit according to an example embodiment.

FIG. 7 is a circuit diagram illustrating the amplifying circuit 100a according to an example embodiment. Descriptions already provided above with reference to FIGS. 5 and 6 are omitted.

Referring to FIG. 7, the amplifying circuit 100a may include the CMFB circuit 110a, a first amplifier 120a, a second amplifier 130a, and a feedforward circuit 140a. The CMFB circuit 110a and the first amplifier 120a may be substantially the same as or similar to the CMFB circuit 110 and the first amplifier 120, respectively, in FIG. 5 and descriptions thereof are omitted.

The feedforward circuit 140a may include a first transistor FT1, a second transistor FT2, a third transistor FT3, a fourth transistor FT4, and a third current source CG3. A gate terminal of the first transistor FT1 may receive the second input voltage Vin1n via a second input terminal, and the first transistor FT1 may adjust the current between a first output terminal O1 and the third current source CG3 based on the second input voltage Vin1n. A gate terminal of the second transistor FT2 may receive the second input voltage Vin1n via a first input terminal, and the second transistor FT2 may adjust the current between a second output terminal O2 and the third current source CG3 based on the first input voltage Vin1p.

The third transistor FT3 may adjust the current applied from the power supply voltage at the first output terminal O1 based on a voltage level of the first output terminal O1. The fourth transistor FT4 may adjust the current applied from the power supply voltage at the second output terminal O2 based on a voltage level of the second output terminal O2. The first feedforward voltage Vffp applied to the first output terminal O1 may be applied to a gate terminal of the ninth transistor AT9 included in the second amplifier 130a, and the second feed forward voltage Vffn applied to the second output terminal O2 may be applied to a gate terminal of the tenth transistor AT10 included in the second amplifier 130a.

Although the ninth transistor AT9 and the tenth transistor AT10 included in the second amplifier 130a in FIG. 5 are applied with a constant third bias voltage Vb3 at the gate terminals, the first feedforward voltage Vffp or the second feedforward voltage Vffn that are generated based on the first input voltage Vin1p or the second input voltage Vin1n, respectively, may be applied to the gate terminals of the ninth transistor AT9 and the tenth transistor AT10 included in the second amplifier 130a according to an embodiment shown in FIG. 7. Accordingly, noise of the second amplifier 130a may be reduced and the stability of the amplifying circuit 100a may be increased compared to the embodiment shown in FIG. 5.

Figure 8:
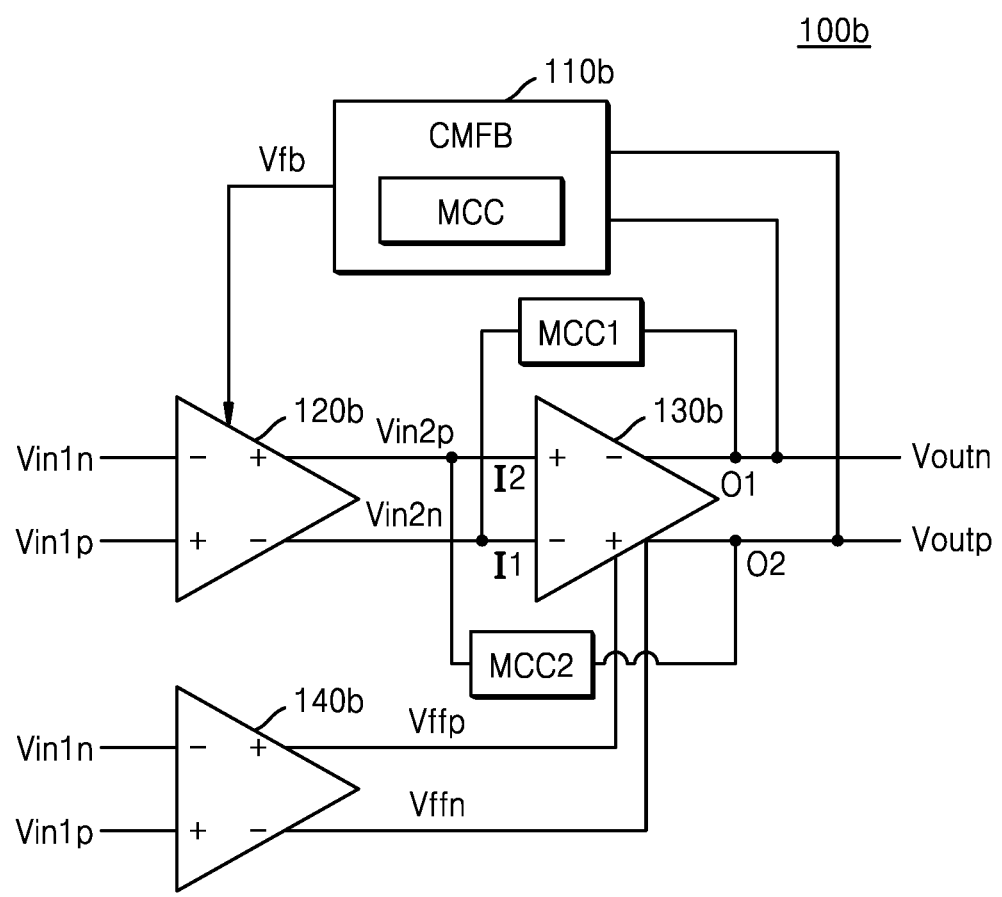
FIG. 8 is a block diagram illustrating an amplifying circuit according to an example embodiment.

FIG. 8 is a block diagram illustrating an amplifying circuit 100b according to an example embodiment. Descriptions already provided above with reference to FIG. 6 are omitted.

Referring to FIG. 8, the amplifying circuit 100b may include a CMFB circuit 110b, a first amplifier 120b, a second amplifier 130b, and a feedforward circuit 140b. The CMFB circuit 110b, the first amplifier 120b, and the feedforward circuit 140b may be substantially the same as or similar to the CMFB circuit 110a, the first amplifier 120a, and the feedforward circuit 140a, respectively, in FIG. 6 and descriptions thereof are omitted.

The second amplifier 130b may include a first MCC (MCC1) connected between a first input terminal I1 and the first output terminal O1, and a second MCC (MCC2) connected between a second input terminal I2 and the second output terminal O2. The first and second MCCs (MCC1 and MCC2) may include at least one of a resistor and a capacitor. The first and second MCCs (MCC1 and MCC2) may perform the Miller compensation for the amplifying circuit 100b. In other words, as described above, the first and second MCCs (MCC1 and MCC2) may perform the main pole compensation for the amplifying circuit 100b and add the negative zero, and thus, may increase the stability of the amplifying circuit 100b.

Although an embodiment is illustrated in FIG. 8 in which the second amplifier 130b is connected to two MCCs (MCC1 and MCC2), this is only an example embodiment, and the technical idea of the present disclosure may be applied to an embodiment in which the second amplifier 130b includes fewer or more than two MCCs.

Figure 9:
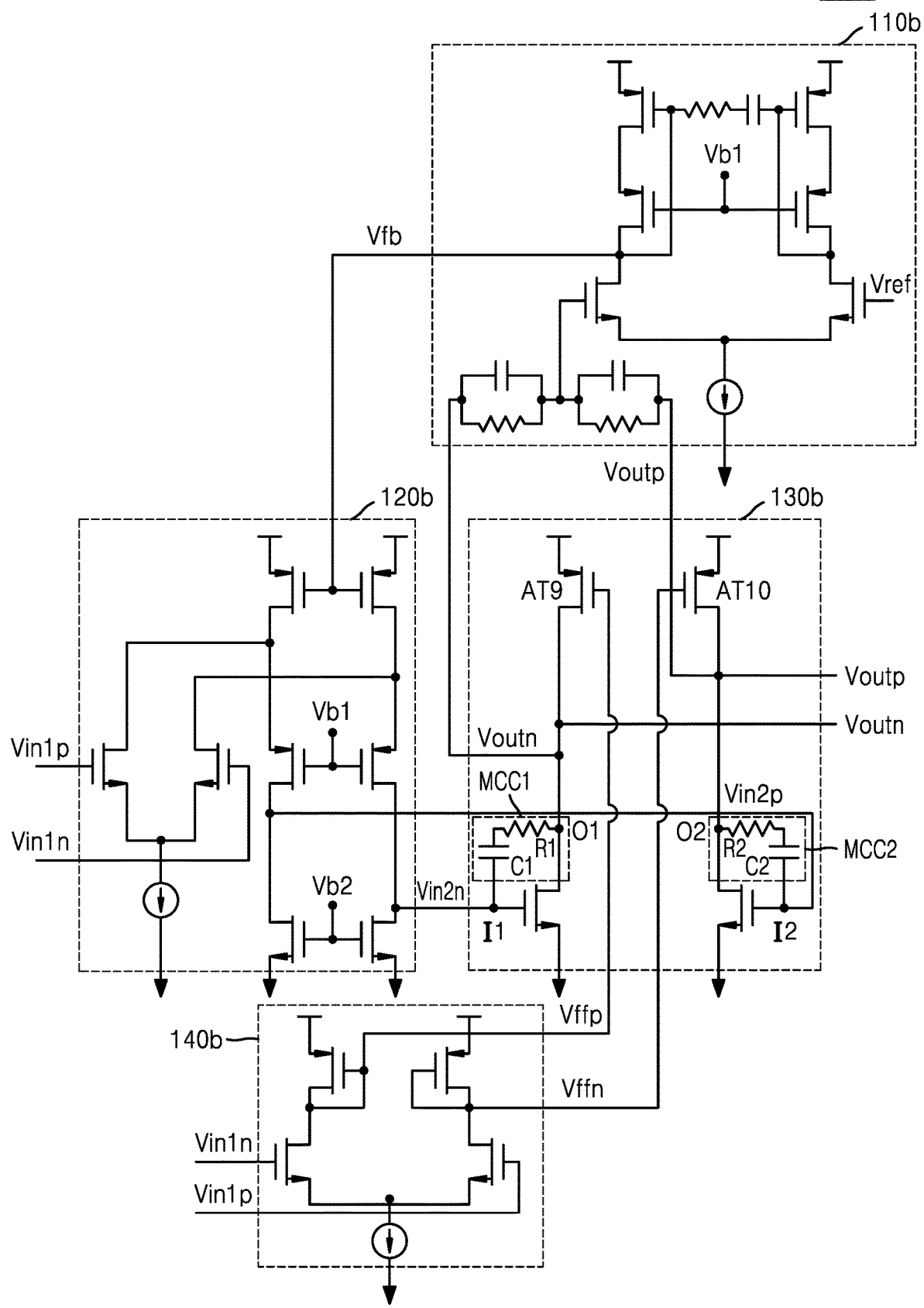
FIG. 9 is a circuit diagram illustrating an amplifying circuit according to an example embodiment.

FIG. 9 is a circuit diagram illustrating the amplifying circuit 100b according to an example embodiment. Descriptions already provided above with reference to FIGS. 7 and 8 are omitted.

Referring to FIG. 9, the amplifying circuit 100b may include the CMFB circuit 110b, the first amplifier 120b, the second amplifier 130b, and the feedforward circuit 140b. The CMFB circuit 110b, the first amplifier 120b, and the feedforward circuit 140b may be substantially the same as or similar to the CMFB circuit 110a, the first amplifier 120a, and the feedforward circuit 140a in FIG. 7, respectively, and descriptions thereof are omitted.

The second amplifier 130b may include the first MCC (MCC1) connected between the first input terminal I1 and the first output terminal O1, and the second MCC (MCC2) connected between the second input terminal I2 and the second output terminal O2. The first MCC (MCC1) may include the first resistor R1 and the first capacitor C1 connected in series, and the second MCC (MCC2) may include the second resistor R2 and the second resistor R2 connected in series. The first resistor R1 and the second resistor R2 may add the negative zero to the amplifying circuit 100b, and the first capacitor C1 and the second capacitor C2 may perform the main pole compensation due to the Miller effect. As the zero point of the negative region is added and the main pole is compensated, the stability of the whole amplifying circuit 100b may be increased.

Figure 10:
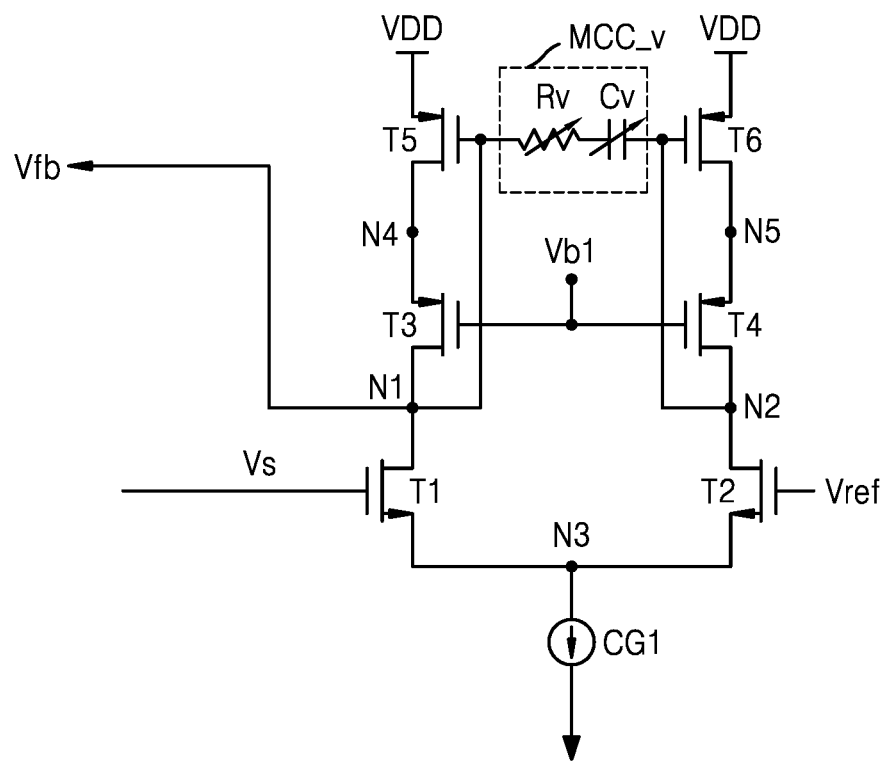
FIG. 10 is a circuit diagram illustrating an operational amplifier according to an example embodiment.

FIG. 10 is a circuit diagram illustrating an operational amplifier 111c according to an example embodiment. Descriptions already provided above with reference to FIG. 3 are omitted.

Referring to FIG. 10, an operational amplifier 111c may be included in the CMFB circuit (110 in FIG. 2). The operational amplifier 111c may include the first transistor T1, the second transistor T2, the third transistor T3, the fourth transistor T4, the fifth transistor T5, the sixth transistor T6, the first current source CG1, and a variable MCC (MCC_v). The first transistor T1, the second transistor T2, the third transistor T3, the fourth transistor T4, the fifth transistor T5, and the sixth transistor T6 may be the same as or similar to those included in the operational amplifier 111, and a description thereof is omitted.

The variable MCC (MCC_v) may include a variable resistor Rv and a variable capacitor Cv connected in series to each other. A resistance value of the variable resistor Rv may be changed according to an external control and a capacitance value of the variable capacitor Cv may also be changed according to an external control. As the variable MCC (MCC_v) includes the variable resistor Rv and the variable capacitor Cv, the operational amplifier 111c according to an example embodiment of the present disclosure may change a position of the zero point and adjust a degree of the main pole compensation.

Figure 11:
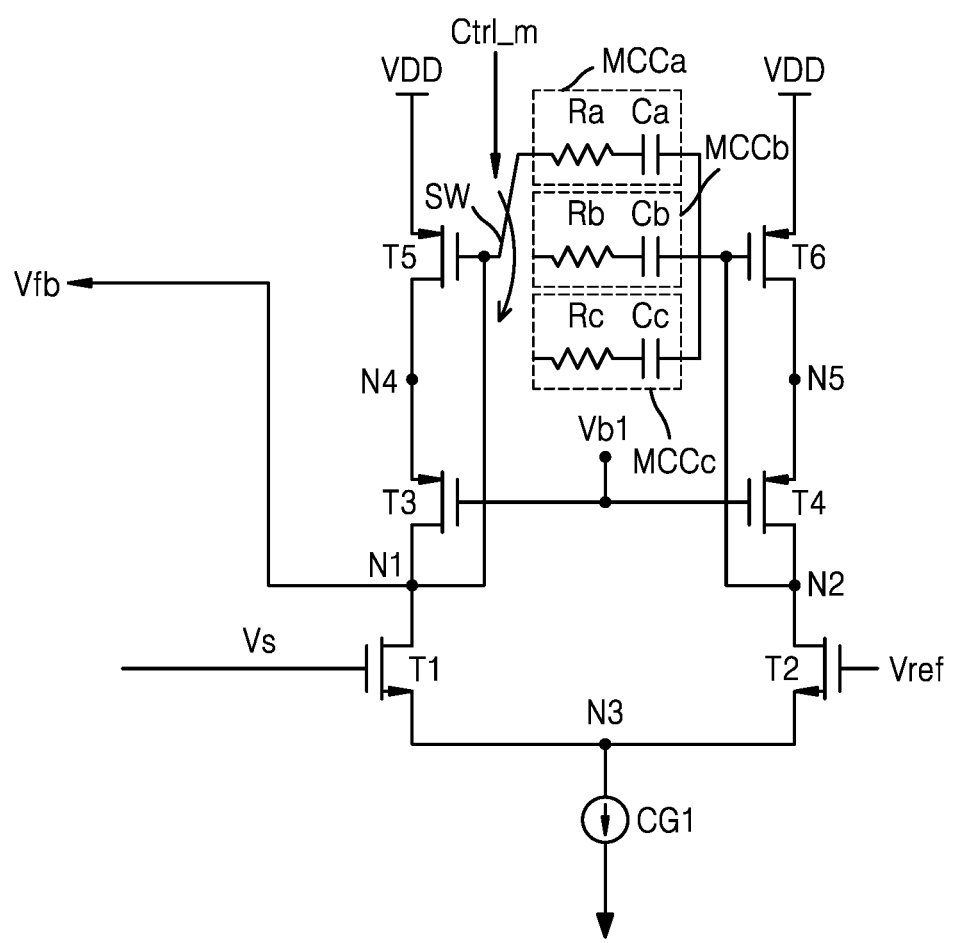
FIG. 11 is a circuit diagram illustrating an operational amplifier according to an example embodiment.

FIG. 11 is a circuit diagram illustrating an operational amplifier 111d according to an example embodiment. Descriptions already provided above with reference to FIG. 3 are omitted.

Referring to FIG. 11, the operational amplifier 111d may be included in the CMFB circuit (110 in FIG. 2). The operational amplifier 111d may include the first transistor T1, the second transistor T2, the third transistor T3, the fourth transistor T4, the fifth transistor T5, the sixth transistor T6, the first current source CG1, a switch SW, a first MCC (MCCa), a second MCC (MCCb), and a third MCC (MCCc). The first transistor T1, the second transistor T2, the third transistor T3, the fourth transistor T4, the fifth transistor T5, and the sixth transistor T6 may be the same as or similar to those included in the operational amplifier 111, and a description thereof is omitted.

The first mirror MCC (MCCa) may include a first resistor Ra and a first capacitor Ca, the second MCC (MCCb) may include a second resistor Rb and a second capacitor Cb, and the third MCC (MCCc) may include a third resistor Rc and a third capacitor Cc. The switch SW may receive a control signal Ctrl_m from the outside, and connect any one of the first MCC (MCCa), the second MCC (MCCb), and the third MCC (MCCc) to the operational amplifier 111d based on the control signal Ctrl_m. Accordingly, the operational amplifier 111d according to the embodiment of the present disclosure may change the position of the zero point and adjust the degree of the main pole compensation.

Figure 12:
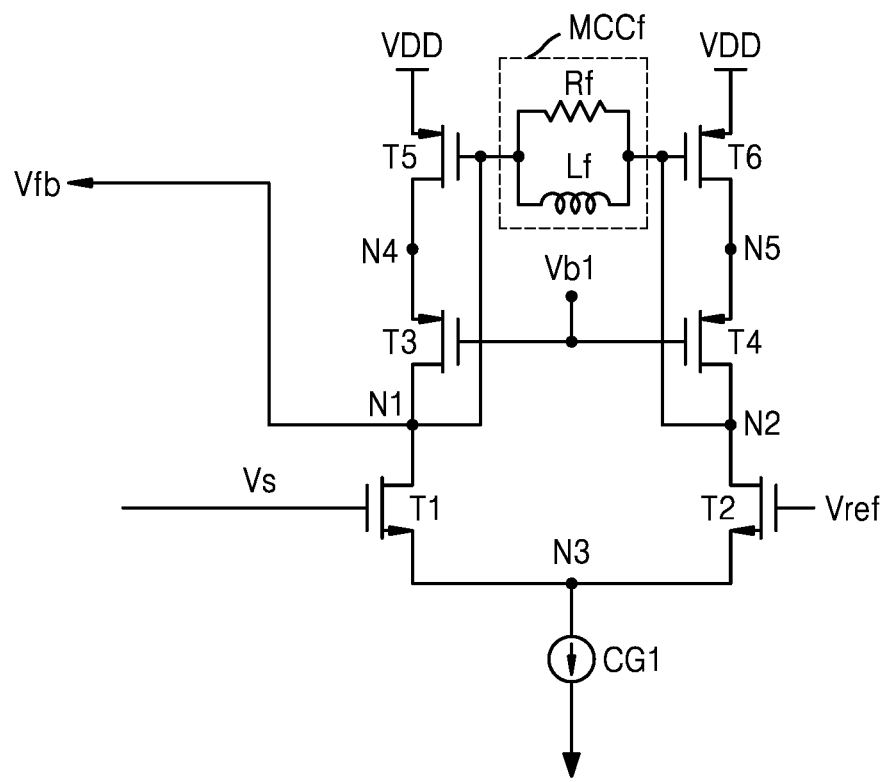
FIG. 12 is a circuit diagram illustrating an operational amplifier according to an example embodiment.

FIG. 12 is a circuit diagram illustrating an operational amplifier 111f according to an example embodiment. Descriptions already provided above with reference to FIG. 3 are omitted.

Referring to FIG. 12, the operational amplifier 111f may include the first transistor T1, the second transistor T2, the third transistor T3, the fourth transistor T4, the fifth transistor T5, the sixth transistor T6, the first current source CG1, and an MCC (MCCf). The first transistor T1, the second transistor T2, the third transistor T3, the fourth transistor T4, the fifth transistor T5, and the sixth transistor T6 may be the same as or similar to those included in the operational amplifier 111, and a description thereof is omitted.

The MCC (MCCf) may include a first resistor Rf and a first inductor Lf connected in parallel with each other. The first resistor Rf and the first inductor Lf connected in parallel with each other may be replaced by the Miller resistor Rm and the Miller capacitor Cm connected in series to each other, as illustrated in the MCC in FIG. 3. Thus, according to one embodiment of the present disclosure, the MCC (MCCf) may be implemented by using a resistor and an inductor.

Figure 13:
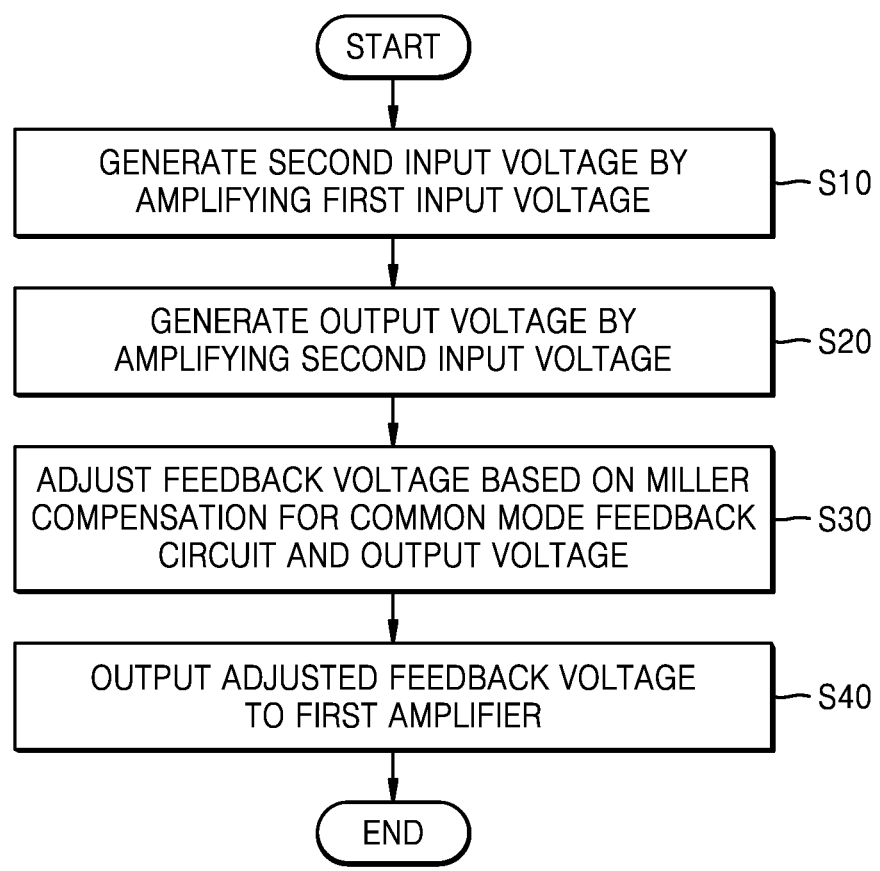
FIG. 13 is a flowchart of an operation of an amplifying circuit according to an example embodiment.

FIG. 13 is a flowchart of an operation of an amplifying circuit, according to an example embodiment.

Referring to FIGS. 2 and 13, the first amplifier 120 may generate second differential input voltages, which are the third and fourth input voltages Vin2p and Vin2n, by amplifying first differential input voltages, which are the second and first input voltages Vin1n and Vin1p, respectively (S10). The second amplifier 130 may generate differential output voltages, which are the second and first output voltages Voutn and Voutp, by amplifying the second differential input voltages, which are the third and fourth input voltages Vin2p and Vin2n, respectively (S20). The MCC included in the CMFB circuit 110 may perform the Miller compensation for the CMFB circuit 110 based on a result of sensing the differential output voltages, which are the second and first output voltages Voutn and Voutp, and may adjust the feedback voltage Vfb based on the differential output voltages, which are the second and first output voltages Voutn and Voutp (S30). The CMFB circuit 110 may output the adjusted feedback voltage Vfb to the first amplifier 120 (S40).

Figure 14:
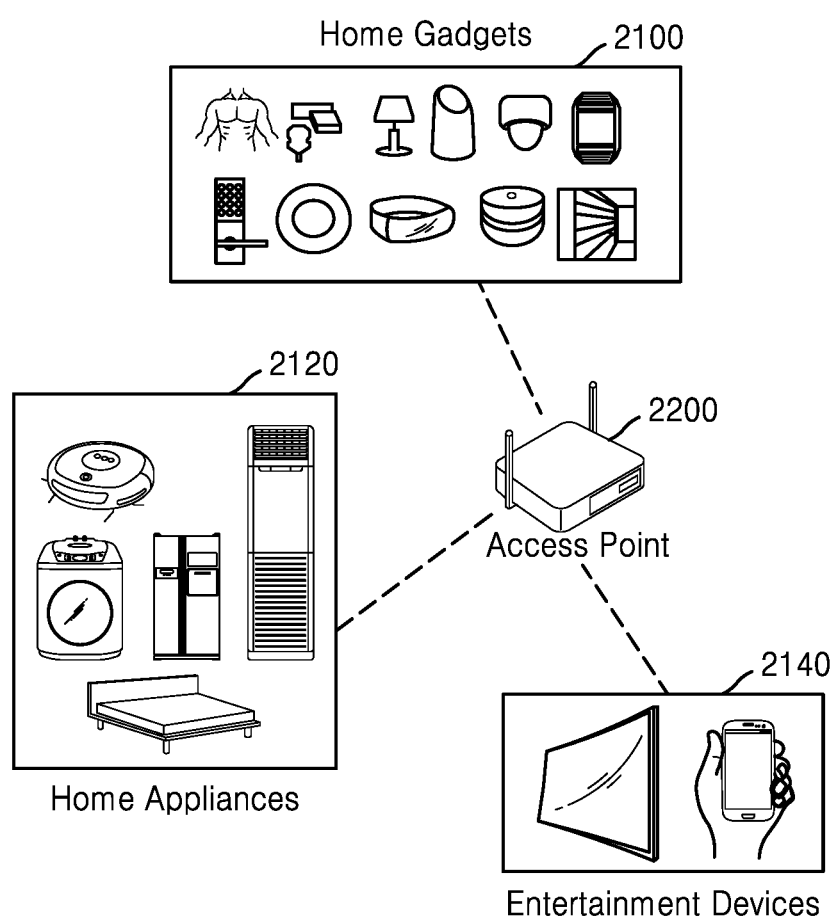
FIG. 14 is a diagram illustrating communication apparatuses including a communication device according to an example embodiment.

FIG. 14 is a diagram illustrating communication apparatuses including a communication device according to an example embodiment.

Referring to FIG. 14, a home gadget 2100, a home appliance 2120, an entertainment device 2140, and an access point 2200 may include amplifying circuits according to example embodiments of the present disclosure. In some embodiments, the home gadget 2100, the home appliance 2120, the entertainment device 2140, and the access point 2200 may create an Internet of things (IoT) network system. It should be understood that the communication devices illustrated in FIG. 14 are only illustrative, and other communication devices not illustrated in FIG. 14 may include amplifying circuits according to the example embodiments of the present disclosure.

The home gadget 2100, the home appliance 2120, the entertainment device 2140, and the access point 2200 may have voltage signals amplified by the amplifying circuits described above according to example embodiments of the present disclosure. In one embodiment, the home gadget 2100, the home appliance 2120, the entertainment device 2140, and the access point 2200 may include a CMFB circuit including an MCC, and thus, the stability of the home gadget 2100, the home appliance 2120, the entertainment device 2140, and the access point 2200 may be improved. The home gadget 2100 may be, for example, a smart lightbulb, a light fixture, a voice-enabled smart speaker, a smart watch, a smart doorbell, a virtual reality (VR) device, a head-mounted display (HMD), a wearable computing device, a desktop computer, a laptop computer, a tablet computer, a mobile device, etc. The home appliance 2120 may be, for example, a robot vacuum cleaner, a washing machine, a refrigerator, an air conditioner, furniture, etc. The entertainment device 2140 may be, for example, a television, a smartphone, a tablet computer, a personal multimedia player (PMP), an MP3 player, etc. The access point 2200 may be a router, a relay, a repeater, a modem, a gateway, a switch, a hub, a Wi-Fi access point, etc.

As described above, embodiments have been disclosed in the drawings and specification. While the embodiments have been described herein with reference to specific terms, it should be understood that they have been used only for the purpose of describing the technical idea of the present disclosure and not for limiting the scope of the inventive concept as defined in the claims. Therefore, it will be clearly understood by one of ordinary skill in the art that various modifications and equivalent embodiments are possible without departing from the scope of the inventive concept. Accordingly, the scope of protection of the present disclosure should be determined by the technical idea of the following claims.

What is claimed is:

1. An amplifying circuit comprising:
an amplifier configured to receive a first input voltage, and output a first output voltage by amplifying the first input voltage; and
a common-mode feedback circuit configured to enable the first output voltage to operate in a common mode by receiving the first output voltage and performing a feedback to adjust at least one feedback voltage applied to the amplifier based on the first output voltage,
wherein the amplifier comprises:
a first amplifier configured to receive and amplify the first input voltage to generate a second input voltage; and
a second amplifier configured to receive and amplify the second input voltage to generate the first output voltage,
wherein the at least one feedback voltage is applied to the first amplifier, and
wherein the common-mode feedback circuit comprises:
an output voltage sensing circuit configured to output a first sensing voltage by sensing the first output voltage;
an operational amplifier configured to adjust the at least one feedback voltage that is applied to the amplifier, based on the first sensing voltage and a reference voltage; and
a first Miller compensation circuit configured to perform dominant pole compensation by using a Miller effect for the common-mode feedback circuit, the first Miller compensation circuit comprising a first resistor and a first capacitor that are connected in series with each other.

2. The amplifying circuit of claim 1, wherein the operational amplifier comprises:
a first transistor including a first gate terminal to which the first sensing voltage is applied, a first terminal connected to a first node, and a second terminal connected to a third node; and
a second transistor including a second gate terminal to which the reference voltage is applied, a third terminal connected to a second node, and a fourth terminal connected to the third node,
wherein the first Miller compensation circuit is connected between the first node and the second node.

3. The amplifying circuit of claim 2, wherein the at least one feedback voltage comprises a first feedback voltage having a voltage level of the first node.

4. The amplifying circuit of claim 2, wherein the operational amplifier further comprises:
a third transistor comprising a third gate terminal to which a first bias voltage is applied, a fifth terminal connected to a fourth node, and a sixth terminal connected to the first node;
a fourth transistor comprising a fourth gate terminal to which the first bias voltage is applied, a seventh terminal connected to a fifth node, and an eighth terminal connected to the second node;
a fifth transistor comprising a fifth gate terminal connected to the first node, a ninth terminal to which a power supply voltage is applied, and a tenth terminal connected to the fourth node; and
a sixth transistor comprising a sixth gate terminal connected to the second node, an eleventh terminal to which the power supply voltage is applied, and a twelfth terminal connected to the fifth node.

5. The amplifying circuit of claim 1, wherein the first output voltage comprises a first differential output voltage and a second differential output voltage,
wherein the output voltage sensing circuit is configured to:
receive the first differential output voltage at a first input terminal;
receive the second differential output voltage at a second input terminal; and
output the first sensing voltage via an output terminal, and
wherein the output voltage sensing circuit comprises:
a first sensing circuit connected between the first input terminal and the output terminal, the first sensing circuit comprising a second resistor and a second capacitor connected in parallel with each other, and
a second sensing circuit connected between the second input terminal and the output terminal, the second sensing circuit comprising a third resistor and a third capacitor connected in parallel with each other.

6. The amplifying circuit of claim 1, wherein the at least one feedback voltage comprises a first feedback voltage,
wherein the first input voltage comprises a first differential input voltage and a second differential input voltage,
wherein the first amplifier comprises:
a third transistor controlled by the at least one feedback voltage;
a fourth transistor controlled by the at least one feedback voltage;
a fifth transistor controlled by the first differential input voltage;
a sixth transistor controlled by the second differential input voltage;
a seventh transistor and an eighth transistor controlled by a first bias voltage;
a ninth kit transistor controlled by a second bias voltage; and
a tenth transistor controlled by the second bias voltage, and
wherein first gate lengths the ninth transistor and the tenth transistor are greater than second gate lengths of the seventh transistor and the eighth transistor.

7. The amplifying circuit of claim 6, wherein the second amplifier comprises a first input terminal and a second input terminal,
wherein a fifth terminal of the seventh transistor is connected to the fifth transistor and a sixth terminal of the seventh transistor is connected to the first input terminal,
wherein a seventh terminal of the eighth transistor is connected to the sixth transistor and an eighth terminal of the eighth transistor is connected to the second input terminal,
wherein a ninth terminal of the ninth transistor is connected to the first input terminal and a tenth terminal of the ninth transistor is grounded, and
wherein an eleventh terminal of the tenth transistor is connected to the second input terminal and a twelfth terminal of the tenth transistor is grounded.

8. The amplifying circuit of claim 7, wherein the second amplifier further comprises:
a first output terminal;
a second output terminal;
a second Miller compensation circuit connected between the first input terminal and the first output terminal, the second Miller compensation circuit comprising a second resistor and a second capacitor connected in series with each other; and
a third Miller compensation circuit connected between the second input terminal and the second output terminal, the third Miller compensation circuit comprising a third resistor and a third capacitor connected in series with each other.

9. The amplifying circuit of claim 1, further comprising a feedforward circuit connected to the second amplifier, the feedforward circuit being configured to receive the first input voltage and output at least one feedforward voltage to the second amplifier based on the first input voltage.

10. The amplifying circuit of claim 1, wherein the first resistor and the first capacitor are connected in series with each other,
wherein the first resistor is a variable resistor having a resistance value changeable by a first external control, and
wherein the first capacitor is a variable capacitor having a capacitance value changeable by a second external control.

11. A common-mode feedback circuit comprising:
an output voltage sensing circuit configured to output a first sensing voltage by sensing a differential voltage that is received from an external circuit; and
an operational amplifier configured to adjust a feedback voltage that is output to the external circuit, based on the first sensing voltage and a reference voltage, to control the differential voltage received from the external circuit to operate in a common mode,
wherein the operational amplifier comprises:
a first transistor comprising a first gate terminal to which the first sensing voltage is applied, a first terminal connected to a first node, and a second terminal connected to a third node;
a second transistor comprising a second gate terminal to which the reference voltage is applied, a third terminal connected to a second node, and a fourth terminal connected to the third node; and
a first Miller compensation circuit in which a first resistor and first capacitor are connected in series with each other, the first Miller compensation circuit being connected between the first node and the second node, and
wherein the feedback voltage has a voltage level of the first node.

12. The common-mode feedback circuit of claim 11, wherein the operational amplifier further comprises:
- a third transistor comprising a third gate terminal to which a first bias voltage is applied, a fifth terminal connected to a fourth node, and a sixth terminal connected to the first node;
- a fourth transistor comprising a fourth gate terminal to which the first bias voltage is applied, a seventh terminal connected to a fifth node, and an eighth terminal connected to the second node;
- a fifth transistor comprising a fifth gate terminal connected to the first node, a ninth terminal to which a power supply voltage is applied, and a tenth terminal connected to the fourth node; and
- a sixth transistor comprising a sixth gate terminal connected to the second node, an eleventh terminal to which the power supply voltage is applied, and a twelfth terminal connected to the fifth node.

13. The common-mode feedback circuit of claim 11, wherein the first resistor has a resistance value of R, the first capacitor has a capacitance value of C, and the first node has an impedance value of 1/gm, and
wherein the common-mode feedback circuit has a transfer function of $$\frac{1+sRC}{1+s\left(R+\frac{2}{gm}\right)C},$$

where s represents a complex variable.

14. The common-mode feedback circuit of claim 11, wherein the differential voltage comprises a first differential output voltage and a second differential output voltage,
wherein the output voltage sensing circuit is configured to:
- receive the first differential output voltage at a first input terminal;
- receive the second differential output voltage at a second input terminal; and
- output the first sensing voltage via an output terminal, and wherein the output voltage sensing circuit comprises:
- a first sensing circuit connected between the first input terminal and the output terminal, the first sensing circuit comprising a second resistor and a second capacitor connected in parallel with each other; and
- a second sensing circuit connected between the second input terminal and the output terminal, the second sensing circuit comprising a third resistor and a third capacitor connected in parallel with each other.

15. An amplifying circuit comprising:
an amplifier configured to receive a first input voltage and output a first output voltage by amplifying the first input voltage; and
an operational amplifier configured to adjust a feedback voltage applied to the amplifying circuit based on the first output voltage and a reference voltage,
wherein the operational amplifier comprises:
- a first transistor including a first gate terminal to which a first sensing voltage generated based on the first output voltage is applied, a first terminal connected to a first node, and a second terminal connected to a third node;
- a second transistor including a second gate terminal to which the reference voltage is applied, a third terminal connected to a second node, and a fourth terminal connected to the third node; and
- a first Miller compensation circuit connected between the first node and the second node, the first Miller compensation circuit comprising at least one of a first resistor and a first capacitor, and
wherein the feedback voltage has a voltage level of the first node.

16. The amplifying circuit of claim 15, wherein the amplifier comprises:
- a first amplifier configured to receive and amplify the first input voltage to generate a second input voltage; and
- a second amplifier configured to receive and amplify the second input voltage to generate the first output voltage,
wherein the feedback voltage is applied to the first amplifier, and
wherein the second amplifier comprises a second Miller compensation circuit including a second resistor and a second capacitor connected in series with each other.

17. The amplifying circuit of claim 16, wherein the first Miller compensation circuit comprises a first inductor connected in parallel with the first resistor.

* * * * *